United States Patent
Feyh

(10) Patent No.: US 7,868,298 B2
(45) Date of Patent: Jan. 11, 2011

(54) RADIATION SENSOR ELEMENT, METHOD FOR PRODUCING A RADIATION SENSOR ELEMENT AND SENSOR FIELD

(75) Inventor: Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/070,609

(22) Filed: Feb. 19, 2008

(65) Prior Publication Data
US 2008/0265168 A1 Oct. 30, 2008

(30) Foreign Application Priority Data
Feb. 21, 2007 (DE) .................. 10 2007 008 381

(51) Int. Cl.
*G01T 1/24* (2006.01)
*H01L 21/00* (2006.01)

(52) U.S. Cl. .................... 250/370.01; 438/73

(58) Field of Classification Search ............ 250/370.01, 250/338.1, 353; 257/11, 21, 50, 51, 52; 438/73
See application file for complete search history.

(56) References Cited

U.S. PATENT DOCUMENTS

| | | | | |
|---|---|---|---|---|
| 5,599,403 A | * | 2/1997 | Kariya et al. | 136/258 |
| 5,939,971 A | * | 8/1999 | Yong | 338/15 |
| 6,034,374 A | * | 3/2000 | Kimura et al. | 250/370.08 |
| 6,144,030 A | * | 11/2000 | Ray et al. | 250/338.4 |
| 6,194,740 B1 | * | 2/2001 | Zhang et al. | 257/59 |
| 6,346,703 B1 | | 2/2002 | Lee et al. | |
| 6,392,232 B1 | * | 5/2002 | Gooch et al. | 250/332 |
| 6,655,834 B1 | * | 12/2003 | Frey et al. | 374/179 |
| 6,667,479 B2 | * | 12/2003 | Ray | 250/338.1 |
| 2007/0170363 A1 | * | 7/2007 | Schimert et al. | 250/353 |

* cited by examiner

*Primary Examiner*—David P Porta
*Assistant Examiner*—Faye Boosalis
(74) *Attorney, Agent, or Firm*—Kenyon & Kenyon LLP

(57) ABSTRACT

A radiation sensor element and a method for producing it, as well as a sensor field having a plurality of such radiation sensor elements, the radiation sensor element having a substrate and a planar sensor structure disposed above the substrate in a first plane, and a lead structure being disposed in a second plane between the substrate and the sensor structure.

16 Claims, 4 Drawing Sheets

RADIATION SENSOR ELEMENT, METHOD FOR PRODUCING A RADIATION SENSOR ELEMENT AND SENSOR FIELD

BACKGROUND OF THE INVENTION

1. Field of the Invention

The present invention relates to a radiation sensor element, a sensor field having a plurality of radiation sensor elements, and a method for producing the radiation sensor element.

2. Description of Related Art

A radiation sensor element is generally known. For example, U.S. Pat. No. 6,346,703 describes a resistive bolometer sensor having three compensation sensors in a bridge circuit. In order to improve the sensitivity of a bolometer sensor, it is necessary to thermally decouple the sensor surface from the substrate. The degree of decoupling is influenced by the geometry of the lead. Since a reduction of the lead cross-section increases the lead resistance, the lead length is the essential free parameter for influencing the thermal decoupling. The disadvantage in this connection is that a lengthened lead also takes up a larger area, so that less area is available for the actual sensor, that is, the so-called filling factor—the ratio of the useful sensor area to the total area—drops. In typical resistive bolometers as depicted in FIG. 1, as a rule the filling factor lies between 40% and 70%.

BRIEF SUMMARY OF THE INVENTION

The radiation sensor element according to the present invention, the sensor field and the method of the present invention for producing a radiation sensor element according to the present invention have the advantage that a filling factor is achievable which is markedly higher compared to the related art, even and particularly in the case of especially small radiation sensor elements of, e.g., $10 \times 10$ µm$^2$. By relocating the lead structure below the sensor structure according to the present invention, both long leads for good thermal decoupling as well as high filling factors are attainable. Radiation sensor elements having a high filling factor allow smaller substrate dimensions overall, and therefore less expenditure for materials. In the case of the sensor field provided according to the present invention, the interspaces between the individual radiation sensor elements, thus between the pixels, may be kept particularly small. Advantageously, the sensor field itself may therefore likewise have a smaller size and a lower weight.

Preferably an insulating layer, particularly preferred an oxide or nitride layer, is applied on the substrate preferably made of silicon. It is well-known to one skilled in the art that the first plane in which the planar sensor structure extends is aligned essentially parallel to a main extension direction of the substrate. According to the present invention, the second plane extends between the first plane and the substrate, and is thus likewise aligned essentially parallel to the main extension direction of the substrate. The lead structure is disposed between the substrate and the sensor structure. Within the meaning of the present invention, under this also falls the expression that the lead structure is disposed below the sensor structure. Preferably, the lead structure also does not extend beyond the sensor structure in the spatial directions defining the first and second plane.

To be understood by the lead structure is at least one mechanical and/or electrical connection between the substrate and the sensor structure. As a rule, the lead structure of a radiation sensor element is in two parts, e.g., in the form of two supporting arms. In principle, more than two-part lead structures would also come into consideration if, for example, a mechanical, supporting connection were implemented separate from the electrical contactings. Preferably, however, the sensor structure is electrically contacted to the substrate via the lead structure. To be understood by the planar sensor structure within the meaning of the present invention is a surface that is to be exposed to a radiation and whose change in temperature caused by the incident radiation is measurable on the basis of a resulting change in resistance. The planar sensor structure is also known as a sensor membrane.

According to the present invention, preferably the lead structure is joined in self-supporting manner to the substrate via a first contact. In particular, the first contact extends in a direction perpendicular to the first and second plane, from the substrate to the lead structure. The first contact is formed by patterning a first sacrificial layer, in particular made of oxide or silicon germanium (SiGe). The lead structure is made preferably of polycrystalline silicon or of silicon carbide (SiC), in each case especially preferably p-doped, in order to ensure an electrical conductivity. Also preferred, the sensor structure is joined in self-supporting manner via a second contact to the lead structure, the second contact, like the first contact, preferably being formed by patterning a sacrificial layer, again made in particular of oxide or silicon germanium. The lead structure and the sensor structure therefore each represent self-supporting structures. Particularly preferred, the second contact and the first contact are each disposed in end areas of the lead structure remote from each other. Thus, the second contact features the greatest possible distance along the lead structure from the first contact, thereby providing a particularly good thermal decoupling of the sensor structure from the substrate. One skilled in the art recognizes that, to that end, the first contact does not necessarily have to be disposed at a great spatial distance with respect to the second contact. Preferably, the lead structure has angled supporting arms. In one especially preferred specific embodiment, the lead structure extends in the second plane in a meander form; within the meaning of the present invention, meander form is also intended to include other geometrical shapes of the lead structure, such as the shape of a spiral, by which the length of the lead structure is able to be enlarged on a limited surface.

For example, p-doped polycrystalline silicon or p-doped silicon carbide are used as material for the sensor structure. The thickness of the sensor structure is preferably between 100 nanometers and 20 micrometers. In one preferred specific embodiment, the sensor structure is made porous at least regionally, particularly by electrochemical etching. In this manner, the radiation absorption of the sensor structure is increased, an advantageous enhancement of the sensitivity thereby being achieved. Preferably a 100 nanometer to 5 micrometer thick layer of the sensor structure is porously etched. In this case, the entire membrane thickness of the sensor structure should be selected to be greater, e.g., approximately 10 micrometers.

A further subject matter of the present invention is a sensor field having a plurality of radiation sensor elements according to the present invention, the radiation sensor elements being disposed on a shared substrate. The individual radiation sensor elements form individually controllable picture elements (pixels) of the sensor field which are arranged in columns and rows in what is referred to as an array. Due to the particularly high filling factor of the radiation sensor elements according to the present invention, advantageously only narrow interspaces of, e.g., approximately one micrometer result between the pixels. The radiation sensor elements are electrically contacted via the substrate, preferably via a plurality of printed circuit traces in the substrate which, particularly preferred, form a matrix drive circuit, all the radiation sensor elements in one row being connected via a row printed circuit trace, and all the radiation sensor elements in one column being connected via a column printed circuit trace. Any combination of one row printed circuit trace with one column printed circuit trace thus defines exactly one radiation sensor element.

A further subject matter of the present invention is a method for producing the radiation sensor element of the present invention, one skilled in the art recognizing that the production of the radiation sensor element also stands for the production of the sensor field. According to the present invention, initially a first sacrificial layer, preferably made of oxide or of silicon germanium, is deposited on the substrate, which is preferably coated with an insulating layer made of oxide or nitride. The use of silicon germanium as sacrificial layer has the advantage that it may be removed later with an etching rate that is higher by many times, which is advantageous, particularly in the case of comparatively large radiation sensor elements, e.g., around $100 \times 100 \, \mu m^2$, since according to the present invention, the entire self-supporting lead structure is undercut by etching. Patterned on the first sacrificial layer is preferably a first contact which supports the self-supporting lead structure after the structure is exposed. As next step, according to the present invention, the lead structure is deposited and patterned on the first sacrificial layer, in the second plane. Preferably p-doped polycrystalline silicon or p-doped silicon carbide is used. A second sacrificial layer is thereupon deposited over it, and on that, preferably a second contact is patterned. Like the first sacrificial layer, the second sacrificial layer is preferably made of oxide or silicon germanium. A further advantage of two sacrificial layers made of silicon germanium is that it can be deposited conductively, which allows a later electrochemical etching, e.g., to provide the sensor structure with pores. The sensor structure is deposited in the first plane, on the second sacrificial layer. Subsequently, the first sacrificial layer and the second sacrificial layer are removed, preferably by vapor-phase etching using hydrogen fluoride (HF) in the case of oxide sacrificial layers, or using chlorine trifluoride ($ClF_3$) in the case of silicon germanium. The manufacturing process according to the present invention is particularly simple and reliable. In one preferred embodiment, in a further process step, the sensor structure is made porous at least regionally before the exposure by removal of the sacrificial layers. Preferably, the pores are produced by electrochemical etching, e.g., using an electrolyte containing hydrofluoric acid.

DETAILED DESCRIPTION OF THE INVENTION

Figure 1:
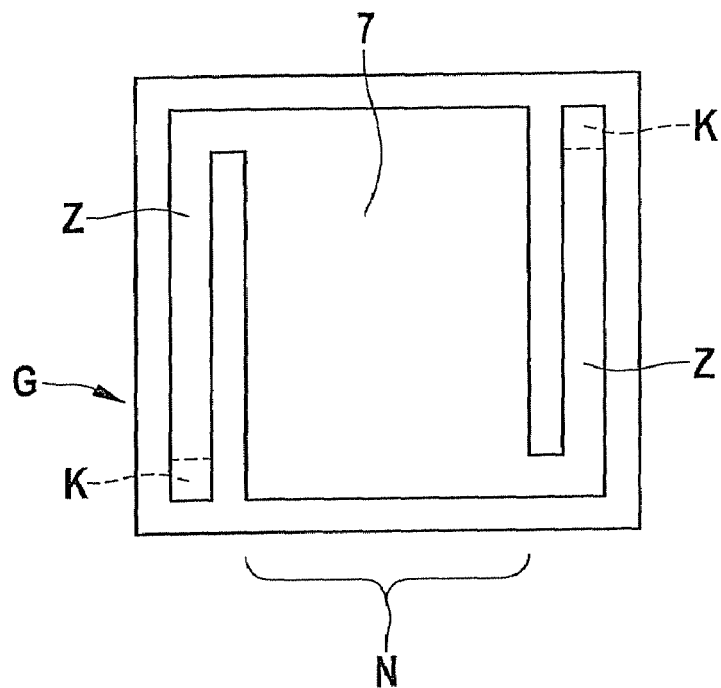
FIG. 1 shows a schematic plan view of a radiation sensor element according to the related art.

FIG. 1 shows schematically a plan view of a radiation sensor element according to the related art. A sensor structure 7 or sensor membrane is situated essentially in a plane with leads Z whose contacting points K are disposed in such a way that leads Z are obtained which are as long as possible, in order to achieve a thermal decoupling of the sensor structure. The area of the sensor membrane 7 is limited to width N. The square denoted by G represents the total area of the radiation sensor element.

Figure 2:
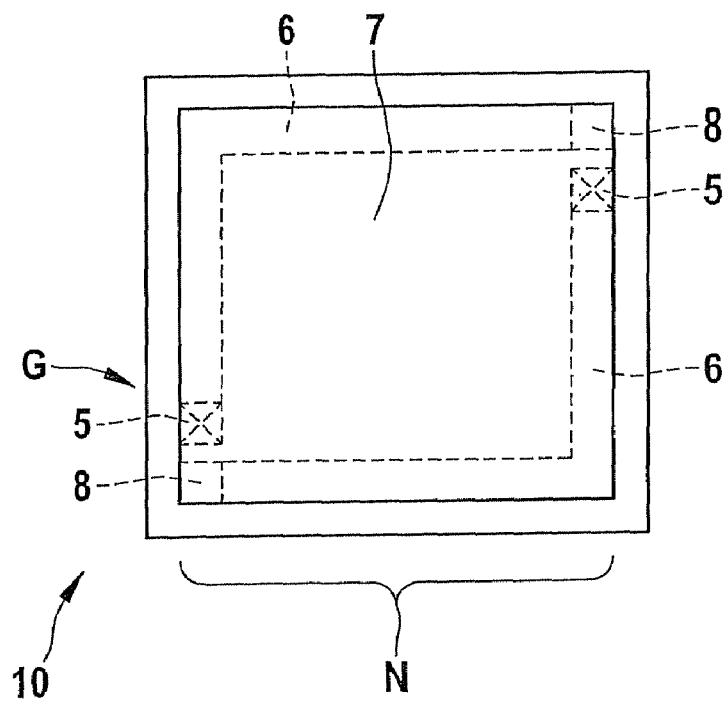
FIG. 2 shows a schematic plan view of a radiation sensor element according to the present invention.

FIG. 2 shows schematically a plan view of a radiation sensor element 10 according to the present invention. Lead structure 6 is located behind sensor structure 7 represented in the paper plane, and is indicated by dot-dash lines. The lead structure has two angled supporting arms. In the area of first contacts 5, lead structure 6 is joined to a substrate (not shown). In the area of second contacts 8, lead structure 6 is joined to sensor structure 7. Width N of the useful area of radiation sensor element 10, i.e. of sensor structure 7, is markedly greater compared to the related art according to FIG. 1. Therefore, radiation sensor element 10 according to the present invention has a larger ratio of useful area to total area G—a higher filling factor. This is particularly critical in the case of small radiation sensor elements 10. Given a $25 \times 25$ $\mu m^2$ total area G, a filling factor of at least 90% is achievable with radiation sensor element 10 according to the present invention. In the case of particularly small radiation sensor elements 10 of, e.g., $10 \times 10 \, \mu m^2$ total area G, a filling factor of 83% is still achievable.

Figure 3:
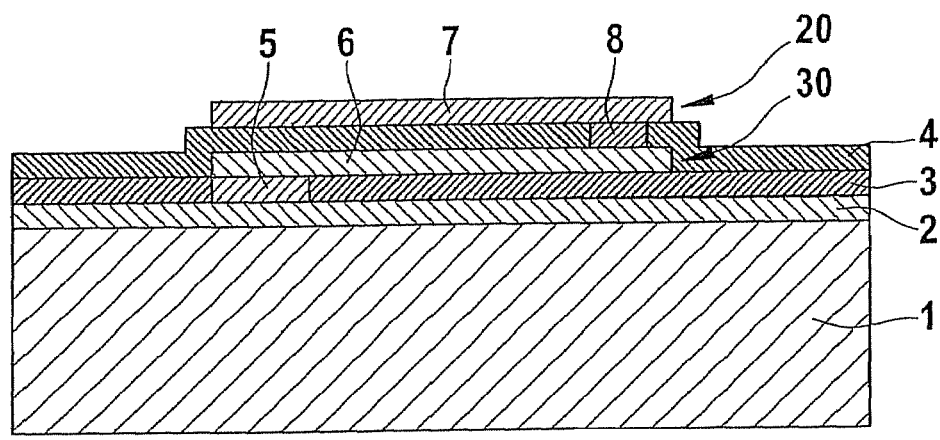
FIGS. 3 and 4 show schematic sectional views of precursor structures of the radiation sensor element according to the present invention, for the purpose of illustrating the manufacturing method according to the present invention.

FIG. 3 shows a precursor structure of radiation sensor element 10 according to the present invention in a sectional view. An insulating layer 2, preferably an oxide layer or nitride layer, is applied on a substrate 1 made of silicon. First sacrificial layer 3, here made of silicon germanium, is deposited on insulating layer 2, and a connector contact 5 is patterned. Connector contact 5 later represents a mechanical and electrical connection to lead structure 6. The later self-supporting lead structure 6, here made of p-doped polycrystalline silicon or silicon carbide, is deposited and patterned on first sacrificial layer 3. Lead structure 6 lies in a second plane 30. As shown in FIG. 2, lead structure 6 is advantageously made as long as possible by an angle bend, in order to achieve better thermal decoupling of sensor structure 7. If desired, the lead structure may also be given a meander shape, thereby making it possible to achieve an even greater length. A second sacrificial layer 4 made of silicon germanium is subsequently deposited on lead structure 6, and a second contact 8 is patterned in it, which later connects self-supporting sensor structure 7 electrically and mechanically to lead structure 6. The layer thicknesses of first sacrificial layer 3 and of second sacrificial layer 4 lie preferably in the range of 0.5 micrometer to 2 micrometers. Sensor structure 7 is now deposited on second sacrificial layer 4, and is patterned as a planar region (see FIG. 2) which extends in a first plane 20. Preferably p-doped polycrystalline silicon or silicon carbide is used as material.

Figure 4:
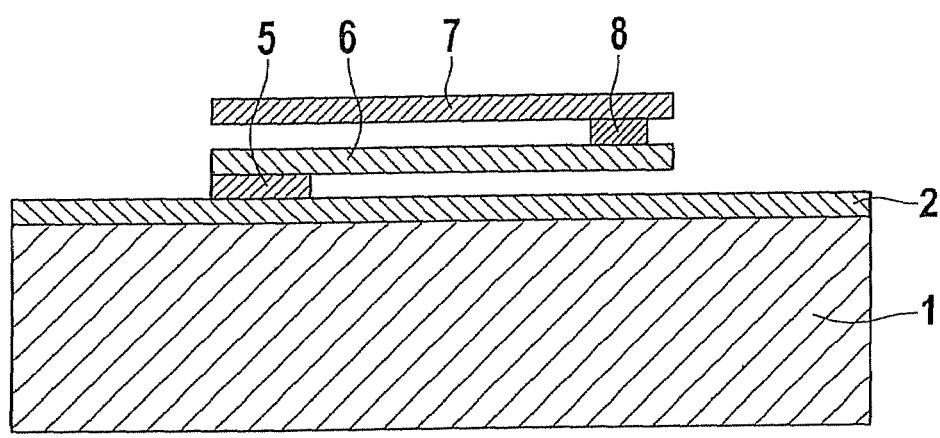

FIG. 4 shows radiation sensor element 10 according to the present invention. After sensor structure 7 is completed, the functional structure is exposed and thermally decoupled by removing first sacrificial layer 3 and second sacrificial layer 4 of silicon germanium as a whole by vapor-phase etching using chlorine trifluoride. Sensor structure 7 undercut except for first contact 5, and lead structure 6 undercut except for second contact 8 are now self-supporting.

Figure 5:
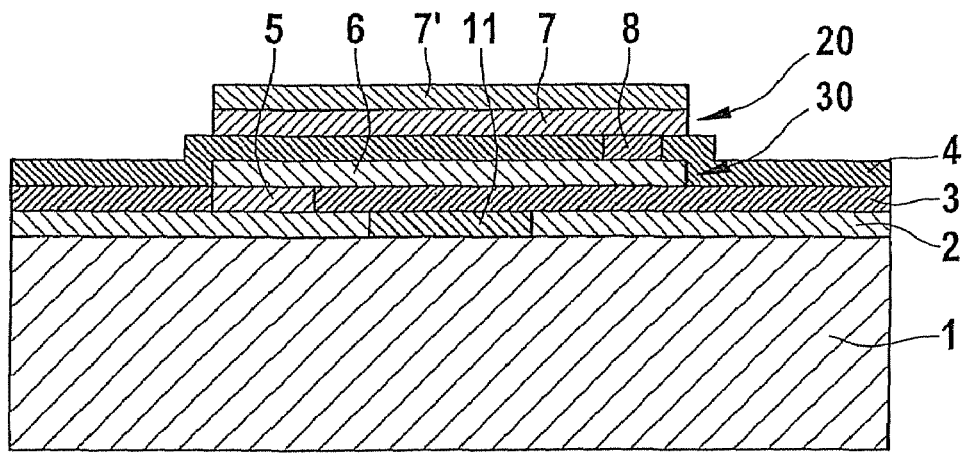
FIGS. 5 and 6 show schematic sectional views of precursor structures of a further specific embodiment of the radiation sensor element according to the present invention, for the purpose of illustrating the manufacturing method according to the present invention.
Figure 6:
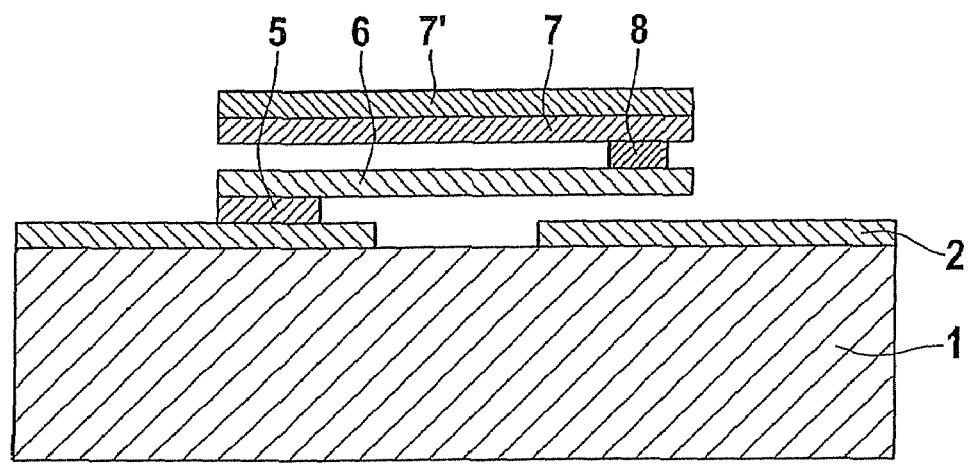

Precursor structures of a further specific embodiment of radiation sensor element 10 according to the present invention are shown in sectional view in FIGS. 5 and 6. The absorption of radiation by sensor structure 7 is improved by providing it with pores in a subregion 7'. A region 7' between 100 nanometers and 5 micrometers thick is made porous by electrochemical etching. In this case, sensor structure 7 is preferably made thicker with approximately 10 micrometers. For the electrochemical etching, an electrical substrate contact 11 is necessary for bridging insulating layer 2. The further electrical contacting is implemented via the doped silicon germanium of first sacrificial layer 3 and of second sacrificial layer 4. The polycrystalline silicon or the silicon carbide of sensor structure 7 are likewise p-doped in order to ensure the flow of current. The structure is exposed only after the pore-producing step. First sacrificial layer 3, second sacrificial layer 4, as well as electrical substrate contact 11 are removed by vapor-phase etching.

Figure 7:
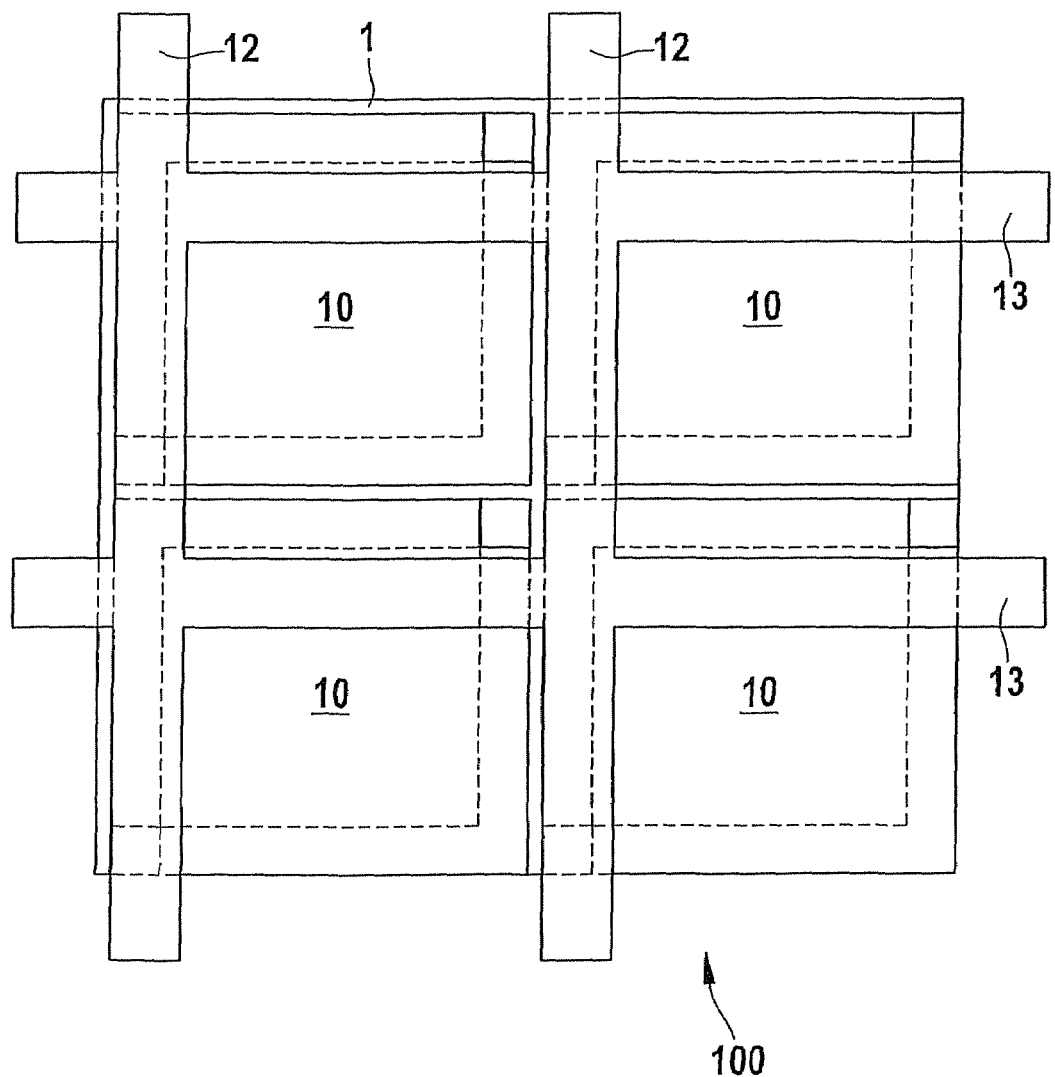
FIG. 7 shows a schematic plan view of a sensor field according to the present invention having a plurality of radiation sensor elements according to the present invention.

FIG. 7 shows schematically a plan view of a sensor field 100 according to the present invention. Radiation sensor elements 10 are arranged as pixels in columns and rows, and advantageously have small interspaces. All radiation sensor elements 10 are electrically contacted via printed circuit traces 12, 13 which run in substrate 1. A matrix drive circuit is shown, in which column printed circuit traces 12 in each case contact all radiation sensor elements 10 in a column, and row printed circuit traces 13 in each case contact all radiation sensor elements 10 of a row, so that any combination of one column printed circuit trace 12 with one row printed circuit trace 13 defines exactly one radiation sensor element 10.

What is claimed is:

1. A radiation sensor element comprising:
a substrate;
a planar sensor structure situated above the substrate in a first plane; and
at least one lead structure situated in a second plane between the substrate and the sensor structure and having an elongated profile that extends in the second plane from a first contact to a second contact, the at least one lead structure having, between the first contact and the second contact, a first portion extending lengthwise in a first direction along the second plane, and a second portion extending lengthwise away from the first portion in a second direction along the second plane, the second direction being transverse to the first direction, the elongated profile being formed entirely of a conductive material and being entirely self-supported between the first contact and the second contact.

2. The radiation sensor element according to claim 1, wherein the lead structure is joined in self-supporting manner to the substrate via the first contact.

3. The radiation sensor element according to claim 2, wherein the sensor structure is joined in self-supporting manner to the lead structure via the second contact, the second contact and the first contact each being situated in end areas of the lead structure remote from each other.

4. The radiation sensor element according to claim 1, wherein the sensor structure is electrically contacted to the substrate via the lead structure.

5. The radiation sensor element according to claim 1, wherein the lead structure extends in a meander form in the second plane.

6. The radiation sensor element according to claim 1, wherein the sensor structure is porous at least regionally.

7. The radiation sensor element according to claim 1, wherein the sensor structure includes a membrane having a resistance that varies in response to a temperature change caused by exposure of the membrane to radiation.

8. The radiation sensor element according to claim 1, wherein the lead structure provides a thermal decoupling effect between the substrate and the planar sensor structure as a result of the elongated profile.

9. The radiation sensor element according to claim 1, wherein the lead structure does not extend beyond the planar sensor structure in spatial directions defining the first and second planes.

10. The radiation sensor element according to claim 1, wherein the radiation sensor element has a filling factor of at least 83%.

11. The radiation sensor element according to claim 1, wherein the radiation sensor element has a filling factor or at least 90%.

12. A sensor field, comprising:
a shared substrate; and
a plurality of radiation sensor elements situated on the shared substrate, each of the radiation sensor elements including:
a planar sensor structure situated above the substrate in a first plane, and
at least one lead structure situated in a second plane between the substrate and the sensor structure and having an elongated profile that extends in the second plane from a first contact to a second contact, the at least one lead structure having, between the first contact and the second contact, a first portion extending lengthwise in a first direction along the second plane, and a second portion extending lengthwise away from the first portion in a second direction along the second plane, the second direction being transverse to the first direction, the elongated profile being formed entirely of a conductive material and being entirely self-supported between the first contact and the second contact.

13. The sensor field according to claim 12, wherein the radiation sensor elements are connected via a plurality of printed circuit traces in the substrate, which form a matrix drive circuit.

14. A method for producing a radiation sensor element, comprising:
depositing a first sacrificial layer;
depositing a lead structure on the first sacrificial layer;
patterning the lead structure to have an elongated profile along a plane corresponding to an upper surface of the first sacrificial layer, the patterned lead structure having a first portion extending lengthwise in a first direction along the plane, and a second portion extending lengthwise away from the first portion in a second direction along the plane, the second direction being transverse to the first direction;
subsequently depositing a second sacrificial layer;
subsequently depositing a sensor structure on the second sacrificial layer; and
subsequently removing the first sacrificial layer and the second sacrificial layer, such that the elongated profile is entirely self-supported between a first contact and a second contact, the elongated profile formed entirely of a conductive material between the first contact and the second contact.

15. The method according to claim 14, further comprising:
patterning a first contact on the first sacrificial layer; and
patterning a second contact on the second sacrificial layer.

16. The method according to claim 14, wherein the sensor structure is made porous at least regionally.

* * * * *